(12) United States Patent
Lin

(10) Patent No.: US 11,610,899 B2
(45) Date of Patent: Mar. 21, 2023

(54) MEMORY CELL, MEMORY ARRAY AND METHOD FOR DEFINING ACTIVE AREA OF MEMORY CELL

(71) Applicant: NANYA TECHNOLOGY CORPORATION, New Taipei (TW)

(72) Inventor: Yuan-Yuan Lin, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 66 days.

(21) Appl. No.: 17/347,924

(22) Filed: Jun. 15, 2021

(65) Prior Publication Data
US 2022/0399348 A1    Dec. 15, 2022

(51) Int. Cl.
*H01L 27/108* (2006.01)

(52) U.S. Cl.
CPC .. *H01L 27/10897* (2013.01); *H01L 27/10894* (2013.01)

(58) Field of Classification Search
CPC .............. H01L 27/10897; H01L 27/10894
See application file for complete search history.

(56) References Cited

U.S. PATENT DOCUMENTS

| | | | | |
|---|---|---|---|---|
| 7,709,320 B2 * | 5/2010 | Cheng | ............... | H01L 29/66181 438/386 |
| 10,083,968 B1 * | 9/2018 | Nagai | ............... | H01L 27/10823 |
| 2008/0001196 A1 * | 1/2008 | Cheng | ............... | H01L 29/66181 257/E21.396 |
| 2009/0315090 A1 | 12/2009 | Weis et al. | | |
| 2018/0059958 A1 * | 3/2018 | Ryan | ...................... | G06F 3/0653 |
| 2021/0066313 A1 * | 3/2021 | Park | .................. | H01L 27/11273 |

FOREIGN PATENT DOCUMENTS

TW             200812012 A       3/2008
WO     WO-2018044607 A1 *   3/2018     ............ G06F 3/0611

OTHER PUBLICATIONS

Office Action and Search Report of corresponding TW Application No. 110139628 and English translation, dated Jul. 25, 2022, 5 pages.

* cited by examiner

*Primary Examiner* — Edward Chin
(74) *Attorney, Agent, or Firm* — Muncy, Geissler, Olds & Lowe, P.C.

(57) ABSTRACT

The present application provides a memory cell, a memory array and a method for preparing the memory cell. The memory cell includes an active area, an isolation structure and a contact enhancement layer. The active area is a surface portion of a semiconductor substrate. A top surface of the active area has a slop part descending toward an edge of the active area within a peripheral region of the active area. The isolation structure is formed in a trench of the semiconductor substrate laterally surrounding the active area. The contact enhancement layer covers the edge of the active area and in lateral contact with the isolation structure. The slope part of the top surface of the active area is covered by the contact enhancement layer, and the contact enhancement layer is formed of a semiconductor material.

6 Claims, 27 Drawing Sheets

MEMORY CELL, MEMORY ARRAY AND METHOD FOR DEFINING ACTIVE AREA OF MEMORY CELL

TECHNICAL FIELD

The present disclosure relates to a memory array and a method for defining active areas in the memory array, and more particularly, to a dynamic random access memory (DRAM) array and a method for defining active areas of the DRAM array.

DISCUSSION OF THE BACKGROUND

In recent decades, demand to storage capability has increased as electronic products continue to improve. In order to increase the storage capability of a memory device (e.g., a DRAM device), more memory cells are arranged in the memory device, and each memory cell in the memory device becomes smaller in size. The memory cells are respectively fabricated on an active area, which is a portion of a semiconductor substrate. Scaling of the active areas is an alternative for reducing size of each memory cell.

Each DRAM cell may include a storage capacitor disposed over an active area and connected to the active area through a capacitor contact. Reduction of the active area may result in shrinkage of a contact area between the capacitor contact and the active area, and may raise a contact resistance of the capacitor contact. Particularly, such shrinkage of contact area is especially significant when the active areas are subjected to encroachment during formation of an isolation structure for defining the active areas. Therefore, a method for keeping the contact resistance of the capacitor contact low without increasing the size of each active area is important in the art.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In an aspect of the present disclosure, a memory cell is provided. The memory cell comprises: an active area, as a surface portion of a semiconductor substrate, wherein a top surface of the active area has a slope part descending toward an edge of the active area within a peripheral region of the active area; an isolation structure, formed in a trench of the semiconductor substrate laterally surrounding the active area; and a contact enhancement layer, covering the edge of the active area and in lateral contact with the isolation structure, wherein the slop part of the top surface of the active area is covered by the contact enhancement layer, and the contact enhancement layer is formed of a semiconductor material.

In some embodiments, the contact enhancement layer extends to an upper part of a sidewall of the trench.

In some embodiments, a topmost end of the contact enhancement layer is substantially coplanar with a planar part of the top surface of the active area surrounded by the slope part of the top surface of the active area.

In some embodiments, the semiconductor substrate and the contact enhancement layer both include silicon.

In some embodiments, the isolation structure comprises a lining layer, extending along a bottom surface and a lower part of the sidewall of the trench; a lower insulating structure, filled in a recess defined by the lining layer; and an upper insulating structure, disposed on the lower insulating structure and the lining layer.

In some embodiments, the lining layer is in contact with the contact enhancement layer from below the contact enhancement layer.

In some embodiments, the contact enhancement layer is in lateral contact with the upper insulating structure.

In some embodiments, a top surface of the lower insulating structure is substantially coplanar with topmost ends of the lining layer.

In some embodiments, the memory cell further comprises a word line, intersected with the active area; a bit line (FIG. 1B, BL), lying over the active area, and connected to the active area through a bit line contact; and a storage capacitor (FIG. 1A, SC), disposed over the active area, and connected to the active area through a capacitor contact.

In some embodiments, the capacitor contact is overlapped with and electrically connected to the active area and the contact enhancement layer.

In another aspect of the present disclosure, a memory array is provided. The memory array comprises: active areas, as surface portions of a semiconductor substrate, wherein a top surface of each active area has a planar part and a slope part descending from the planar part to an edge of each active area within a peripheral region of each active area, a first group of the active areas in a pattern dense region of the memory array are laterally separated by a spacing less than a spacing by which a second group of the active areas in a pattern loose region of the memory array are laterally separated; an isolation structure, formed in a trench of the semiconductor substrate extending between the active areas; and contact enhancement layers, covering the edges of the active areas in the first group, and in lateral contact with the isolation structure, wherein the contact enhancement layers and the planar parts of the top surfaces of the active areas in the first group define contact areas of the active areas in the first group.

In some embodiments, the contact enhancement layers are formed of a semiconductor material.

In some embodiments, the edges of the active areas in the second group are in direct contact with the isolation structure.

In yet another aspect of the present disclosure, a method for preparing a memory cell is provided. The method comprises: forming a trench at a top surface of a semiconductor substrate, wherein an active area of the memory cell is defined in a region of the semiconductor substrate laterally surrounded by the trench; performing an oxidation process to form an oxide layer extending along a bottom surface and a sidewall of the trench, wherein an oxidation depth at a top edge of the active area is greater than an oxidation depth at the sidewall and the bottom surface of the trench; removing an upper portion of the oxide layer covering the top edge of the active area; forming an epitaxial layer to cover the top edges of the active area; and filling up the trench with an insulating material.

In some embodiments, the epitaxial layer is selectively formed on the top edge of the active area.

In some embodiments, the method for preparing the memory cell further comprises: filling up the trench by an additional insulating material after performing the oxidation process and before removing the upper portion of the oxide layer.

In some embodiments, an upper portion of the additional insulating material is removed during removal of the upper portion of the oxide layer, and the remained portion of the additional insulating material forms a lower insulating structure in a lower portion of the trench.

In some embodiments, the insulating material is filled in an upper portion of the trench after formation of the epitaxial layer.

In some embodiments, the insulating material is filled to a height above the top surface of the semiconductor substrate.

In some embodiments, the method for preparing the memory cell further comprises: removing a portion of the insulating material above the top surface of the semiconductor substrate and a portion of the epitaxial layer above the top surface of the semiconductor substrate, wherein the remained portion of the insulating material forms an upper insulating structure in the trench, and the remained portion of the epitaxial layer forms a contact enhancement layer covering the top edge of the active area.

According to the present disclosure, active areas of memory cells in a memory array may be encroached during manufacturing process, and formed with chamfered or rounded top edges. Therefore, top surfaces of the active areas may descend toward these edges within peripheral regions of the active areas. Hence, the descending peripheral regions of the active areas may be covered by an isolation structure filled in a trench extending between the active areas, thus fail to establish electric contact with electrical components disposed on the active areas. By covering the chamfered or rounded top edges of the active areas with contact enhancement layers, surface recesses caused by the descending peripheral regions of the active areas may be filled up by the contact enhancement layers. Since the contact enhancement layers may be formed of a semiconductor material, the contact enhancement layers may be regarded as extra parts of the active areas. These extra parts of the active areas may contribute to electrical contact between the active areas and the electrical components disposed thereon, thus may compensate contact areas loss resulted from the encroachment during manufacturing process. Therefore, electrical contact between the active area and the electrical components disposed thereon can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
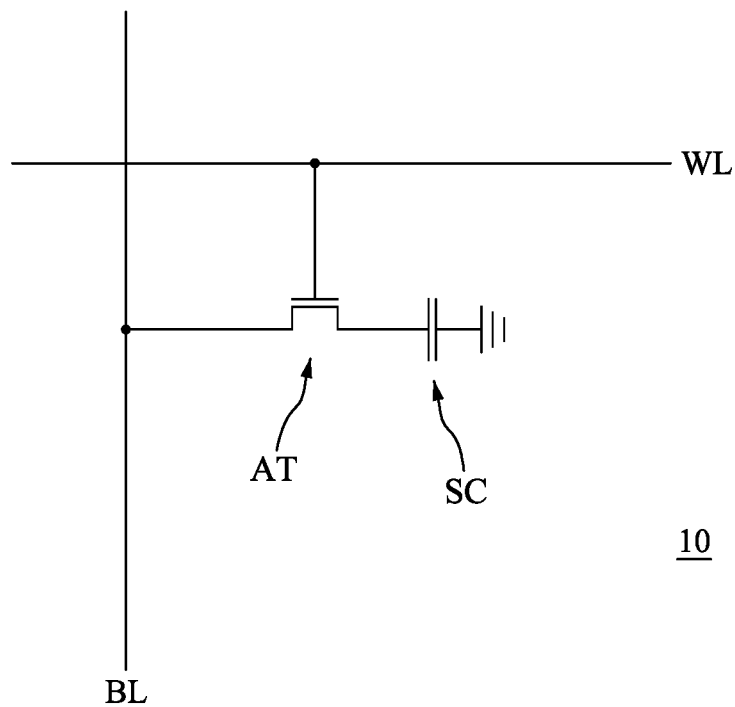
FIG. 1A is a circuit diagram illustrating a memory cell in a memory array, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a circuit diagram illustrating a memory cell 10 in a memory array, according to some embodiments of the present disclosure.

Referring to FIG. 1A, in some embodiments, the memory array is a DRAM array. In these embodiments, each memory cell 10 in the memory array may include a transistor AT and a storage capacitor SC coupled to the transistor AT. The transistor AT is functioned as an access transistor of the memory cell 10, while the storage capacitor SC is configured to store charge. During a write operation, the transistor AT is turned on by asserting a word line WL coupled to a gate terminal of the transistor AT, and a voltage applied on a bit line BL coupled to a source/drain terminal of the transistor AT may be transferred to the storage capacitor SC coupled to the other source/drain terminal of the transistor AT. Accordingly, the storage capacitor SC may be charged or discharged, and a logic state "1" or a logic state "0" can be stored in the storage capacitor SC. During a read operation, the transistor AT is turned on as well, and the charge stored in the storage capacitor SC may pull up or pull down the pre-charged bit line BL. By comparing a voltage on the bit line BL with a reference voltage, the charge stored in the storage capacitor SC can be sensed, and the logic state of the memory cell 10 can be determined.

Figure 1B:
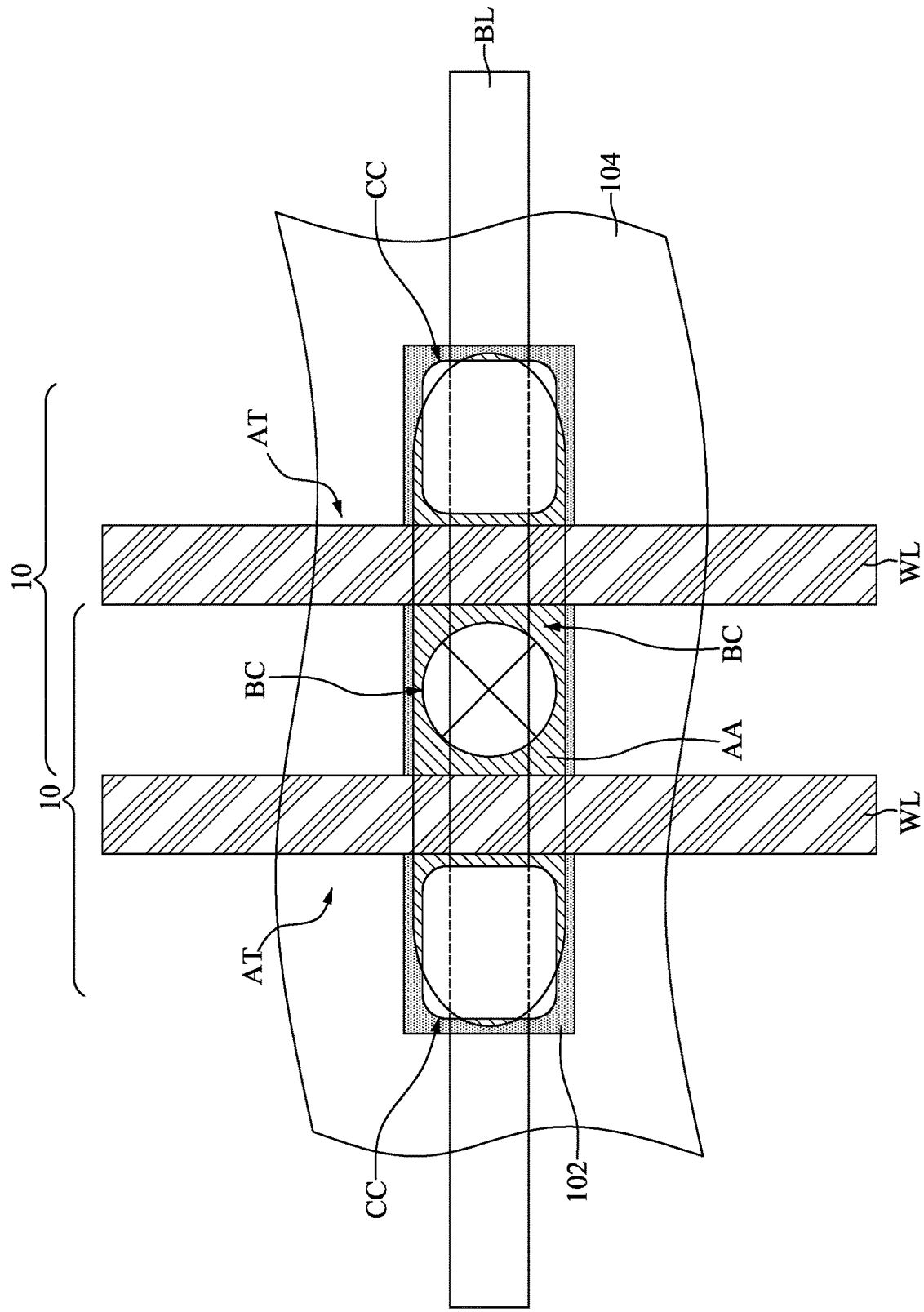
FIG. 1B is a plan view schematically illustrating two of the memory cells in the memory array, according to some embodiments of the present disclosure.

FIG. 1B is a plan view schematically illustrating two of the memory cells 10 in the memory array, according to some embodiments of the present disclosure.

Referring to FIG. 1B, the two memory cells 10 may be formed on an active area AA laterally surrounded by an isolation structure 104 (as will be further described with reference to FIG. 2A and FIG. 2B). The active area AA is intersected with two of the word lines WL. The word lines WL are functioned as gate terminals of the transistors AT in these memory cells 10. Portions of the active area AA at opposite sides of each word line WL are functioned as source/drain terminals of these memory cells 10. One of these portions of the active area AA between the word lines WL may be functioned as a common source/drain terminal of the transistors AT. The common source/drain terminal may be coupled to a shared bit line BL running above the active area AA, and such common source/drain terminal may be coupled to the bit line BL through a bit line contact BC. Others of these portions of the active area AA functioned as source/drain terminals may be each coupled to a storage capacitor SC (not shown in FIG. 1B) through a capacitor contact CC.

The word line WL may be intersected with the bit line BL. Further, the active area AA is intersected with the word line WL, and may be aligned with or intersected with the bit line BL. For instance, the word line WL may be perpendicular to the bit line BL, and the active area AA may be aligned with the bit line BL. However, those skilled in the art may modify extending directions of the word line WL, the bit line BL and the active area AA, the present disclosure is not limited thereto.

Figure 2A:
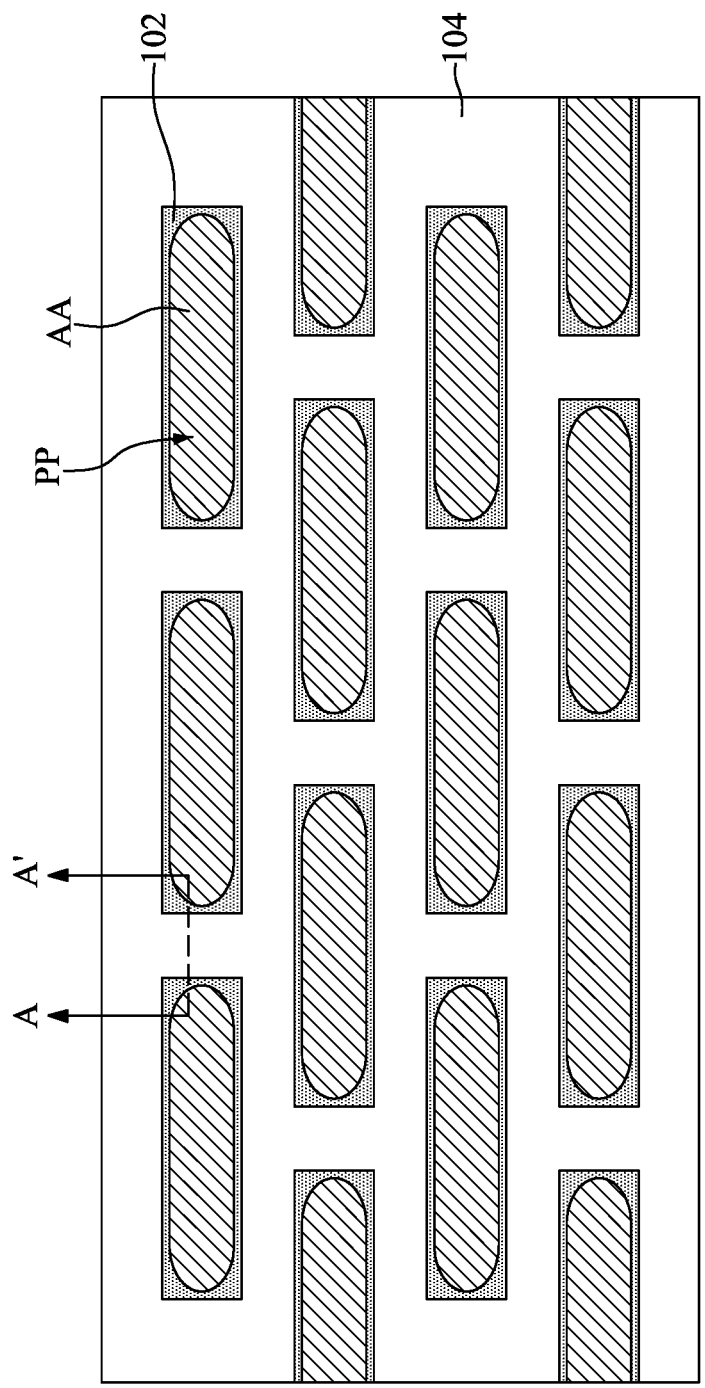
FIG. 2A is a schematic plan view illustrating the active areas in a portion of the memory array, according to some embodiments of the present disclosure.

FIG. 2A is a schematic plan view illustrating the active areas AA in a portion of the memory array, according to some embodiments of the present disclosure. FIG. 2B is a schematic cross-sectional view along a line A-A' as shown in FIG. 2A.

Figure 2B:
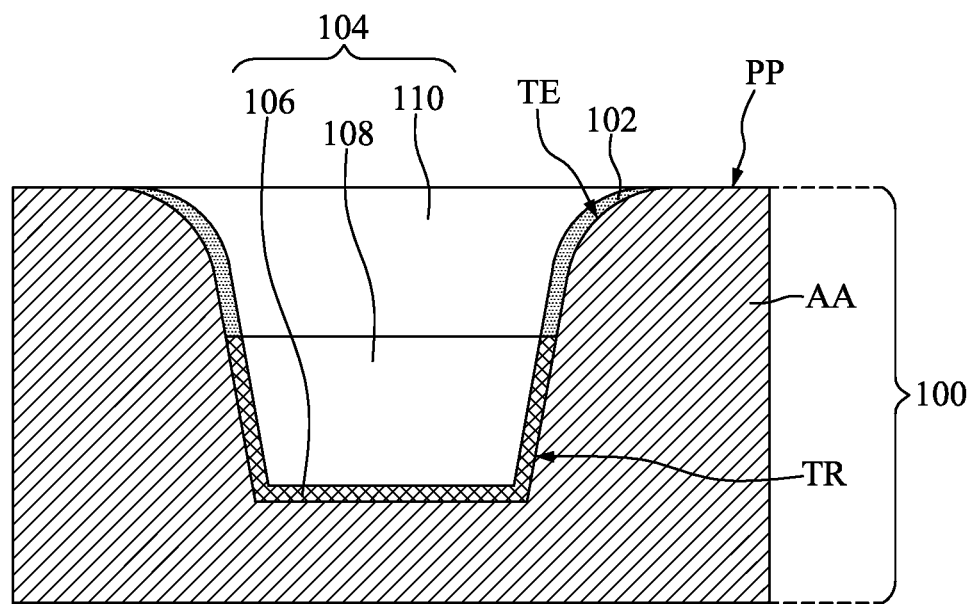
FIG. 2B is a schematic cross-sectional view along a line A-A' as shown in FIG. 2A.

Referring to FIG. 2A and FIG. 2B, the active areas AA are surface portions of a semiconductor substrate 100 (shown in FIG. 2B). The semiconductor substrate 100 may be a semiconductor wafer or a semiconductor-on-insulator (SOI) wafer, such as a silicon wafer or a silicon-on-insulator wafer. The active areas AA are laterally separated from one another, and may be connected to a bottom portion of the semiconductor substrate 100 continuously spanning below the active areas AA (as shown in FIG. 2B). In some embodiments, the active areas AA are arranged as multiple rows, and each active area AA may have a major axis extending along a row direction. For instance, the row direction may be a direction X, and adjacent rows of the active areas AA may be spaced apart along a direction Y perpendicular to the direction X. However, the row direction may alternatively be another direction intersected with the direction X and the direction Y, and so as a direction along which adjacent rows of the active areas AA are spaced apart. Further, these rows may alternately offset from others along the row direction. For instance, as shown in FIG. 2A, even rows of the active areas AA may be laterally offset from odd rows of the active areas AA. Alternatively, these rows of the active areas AA may be aligned with one another.

Further, contact enhancement layers 102 may cover peripheral regions of the active areas AA, respectively. As shown in FIG. 2B, each active area AA may have a chamfered or rounded top edge TE, and a top surface of each active area AA may have a slope part at the peripheral region. The slope part of each active area AA descends outwardly, and may be lower than a planar part PP of each active area AA, which may be functioned as a contact surface for establishing electrical contact with the capacitor contacts CC and the bit line contact BC as described with reference to FIG. 1B. The contact enhancement layer 102 conformally covers the top edge TE of the active area AA, thus the slope part of the top surface of the active area AA is covered by the contact enhancement layer 102. In some embodiments, a topmost end of the contact enhancement layer 102 is substantially coplanar with the planar part PP of the active area AA. The contact enhancement layers 102 are formed of a semiconductor material the same or different from a semiconductor material in the semiconductor substrate 100, and may be regarded as extra parts of the active areas AA. Since the slope parts of the top surfaces of the active areas AA are covered by these extra parts of the active areas AA (i.e., the contact enhancement layers 102), a larger portion of each active area AA (including the peripheral regions) can be used for establishing electrical contact with other electrical components (such as the capacitor contacts CC as described with reference to FIG. 2A). In other words, the contact enhancement layers 102 are able to compensate contact area loss of the active areas AA resulted from the chamfered or rounded top edges TE.

In some embodiments, the top surfaces of the active area AA have larger slope parts at corners of the active areas AA. In these embodiments, as shown in FIG. 2A, each contact enhancement layer 102 may cover more of the top surface of one of the active areas AA at corners of this active area AA. Accordingly, the contact enhancement layers 102 compensate more contact loss at corners of the active areas AA.

Referring to FIG. 1B and FIG. 2B, the capacitor contacts CC overlap the planar part PP of the active area AA, and may further overlap the contact enhancement layer 102 covering the slop part of the top surface of the active area AA. Hence, the capacitor contacts CC may establish electrical contact with the active area AA itself, and with the contact enhancement layer 102 as an extra part of the active area AA. As compared to being electrically connected to the capacitor contacts CC merely through the planar part PP of the active area AA, the active area AA with the extra part (i.e., the contact enhancement layer 102) may be electrically connected to the capacitor contacts CC by a larger contact area and lower contact resistance. As described with reference to FIG. 1B, the capacitor contacts CC may be electrically connected to storage capacitors disposed above the capacitor contacts CC.

In some embodiments, the semiconductor substrate 100 and the contact enhancement layer 102 both include silicon, but the semiconductor substrate 100 is provided as a bulk material while the contact enhancement layer 102 is formed as a material layer. However, as described above, the semiconductor substrate 100 and the contact enhancement layer 102 may be formed of different semiconducting materials. The present disclosure is not limited to the materials of the semiconductor substrate 100 and the contact enhancement layer 102.

Referring to FIG. 2A and FIG. 2B, the isolation structure 104 is filled in a trench TR extending between the active areas AA. As shown in FIG. 2B, a top portion of a sidewall of the trench TR and the top surface of one of the active areas AA define the top edge TE of this active area AA, which is covered by one of the contact enhancement layers 102. In some embodiments, the isolation structure 104 includes a lining layer 106 conformally covering a bottom portion of the trench TR. In these embodiments, the lining layer 106 may be in contact with the contact enhancement layers 102 from below the contact enhancement layers 102, and the sidewall of the trench TR is covered by the lining layer 106 and the contact enhancement layers 102. The lining layer 106 is formed of an insulating material, such as silicon oxide.

Further, the isolation structure 104 may include a lower insulating structure 108 and an upper insulating structure 110. The lower insulating structure 108 is filled in a lower part of the trench TR. In those embodiments where the isolation structure 104 includes the lining layer 106, the lower insulating structure 108 may be filled to a height substantially leveled with a topmost end of the lining layer 106, which may be in contact with bottommost ends of the contact enhancement layers 102. On the other hand, the upper insulating structure 110 is filled in an upper part of the trench TR, and may be in lateral contact with the contact enhancement layers 102. In some embodiments, the upper insulating structure 110 extends from a top surface of the lower insulating structure 108 to a height substantially aligned with the topmost ends of the contact enhancement layers 102. In alternative embodiments, a top surface of the upper insulating structure 110 may be lower or higher than the topmost ends of the contact enhancement layers 102. The lower and upper insulating structures 108, 110 may be respectively formed of an insulating material. In some embodiments, the lower and upper insulating structures 108, 110 are both formed of silicon oxide. However, in alternative embodiments, the lower and upper insulating structures 108, 110 are formed of different insulating materials. The present disclosure is not limited to the material(s) of the lower and upper insulating structures 108, 110.

If the contact enhancement layers 102 are omitted, the upper insulating structure 110 may further cover the top edges TE of the active areas AA. Accordingly, the slope part of the top surface of each active area AA may be covered by an insulating material, and may not contribute to establishment of electrical contact with electrical components disposed thereon (e.g., the capacitor contacts CC). As a result of such contact area loss, a contact resistance between each active area AA and these electrical components (e.g., the capacitor contacts CC) may be raised. In other words, by disposing the contact enhancement layers 102, such problems of contact resistance raise can be resolved.

Moreover, although not shown in FIG. 2B, the word lines WL as described with reference to FIG. 1B may be embedded in the semiconductor substrate 100, and are intersected with one of the active areas AA. In addition, the bit line contact BC as described with reference to FIG. 1B may stand on the planar part PP of one of the active areas AA, and may be electrically connected to the bit line BL lying over the bit line contact BC. In some embodiments, the bit line BL runs below the storage capacitors (not shown) electrically connected to the capacitor contacts CC. However, the present disclosure is not limited to the configuration of the bit line BL and the storage capacitors.

Figure 3:
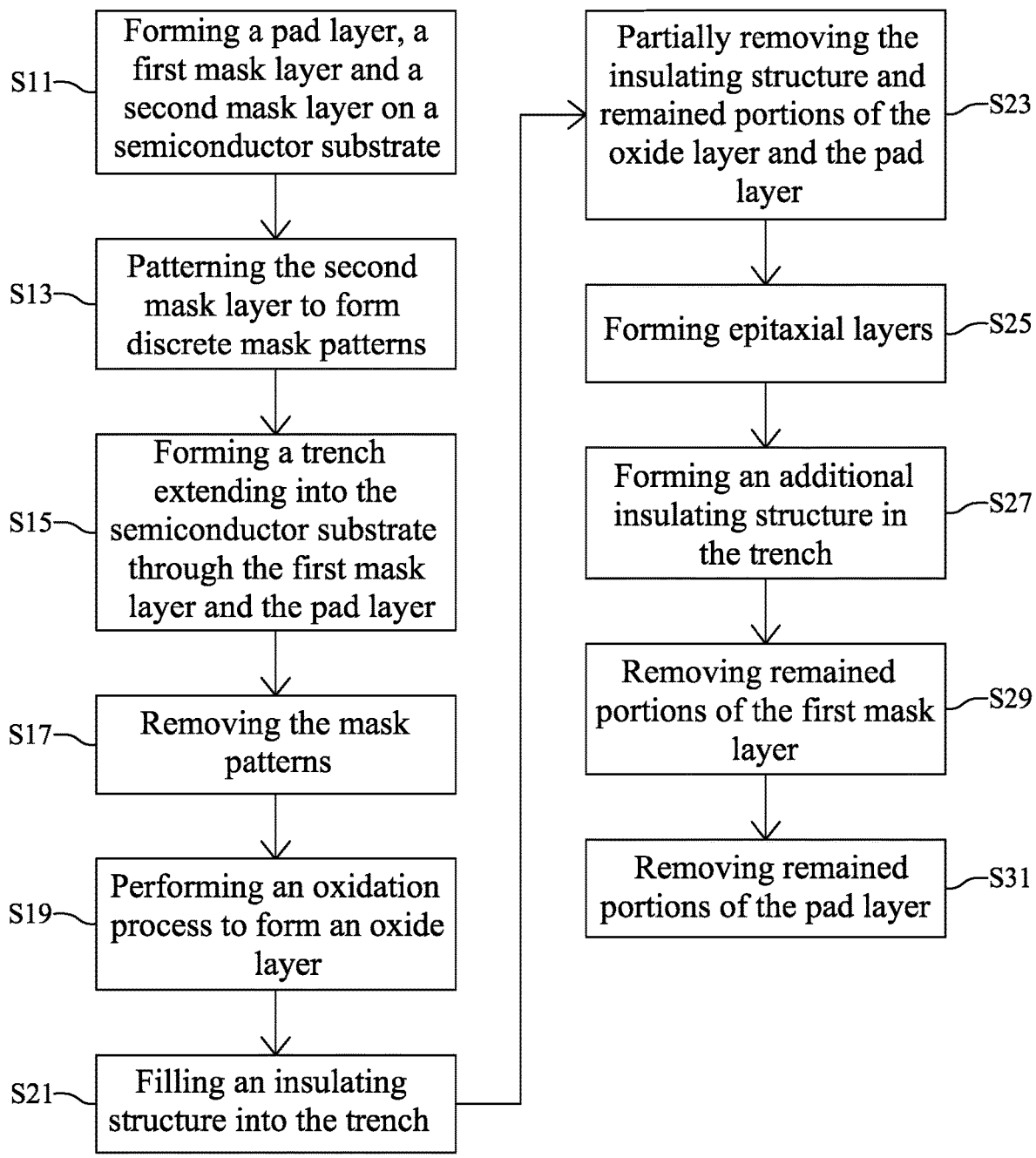
FIG. 3 is a flow diagram illustrating a process for forming a structure as shown in FIG. 2A and FIG. 2B, according to some embodiments of the present disclosure.

FIG. 3 is a flow diagram illustrating a process for forming a structure as shown in FIG. 2A and FIG. 2B, according to some embodiments of the present disclosure. FIG. 4A through FIG. 4J are schematic plan views illustrating intermediate structures at various stages during the process as shown in FIG. 3. FIG. 5A through FIG. 5J are schematic cross-sectional views along line A-A' shown in FIG. 4A through FIG. 4J, respectively.

The active areas AA are defined by the isolation structure 104, thus the process for defining the active areas AA also includes formation of the isolation structure 104.

Figure 4A:
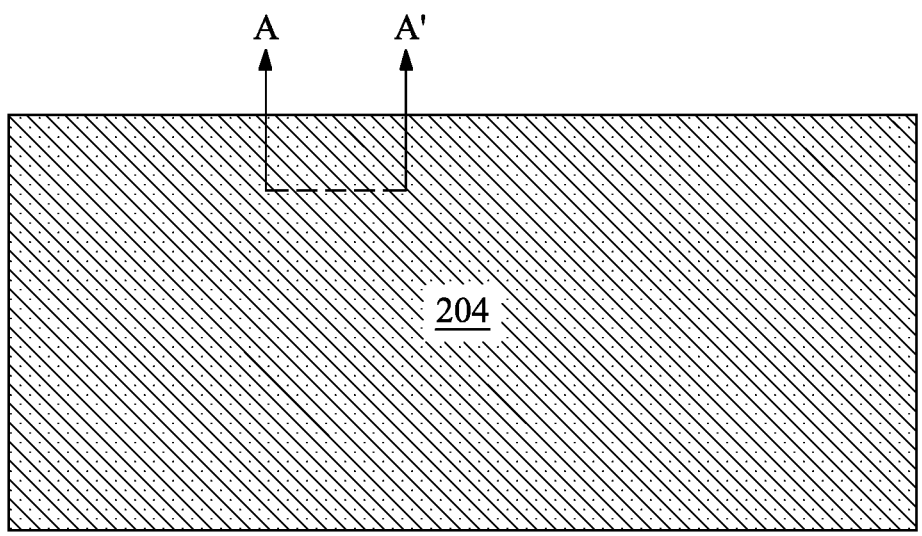
FIG. 4A through FIG. 4J are schematic plan views illustrating intermediate structures at various stages during the process as shown in FIG. 3.
Figure 5A:
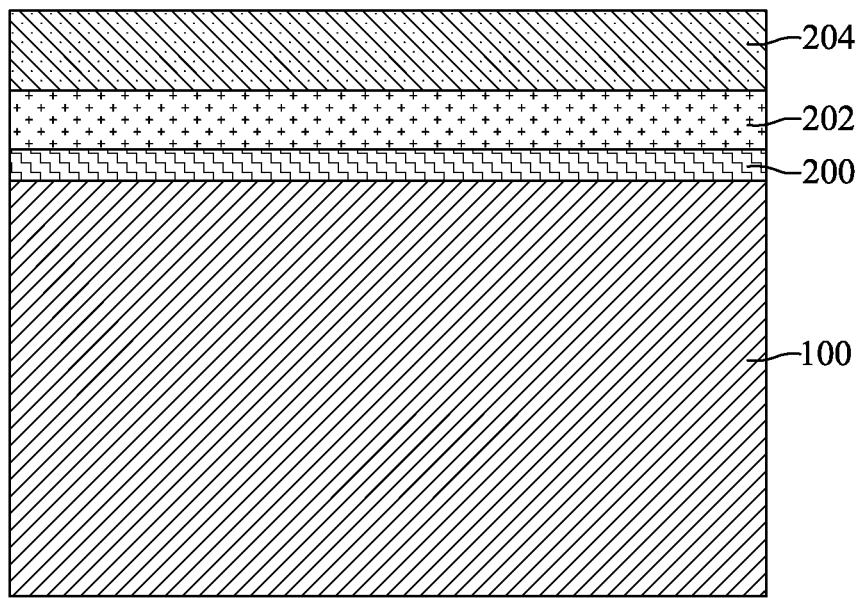
FIG. 5A through FIG. 5J are schematic cross-sectional views along line A-A' shown in FIG. 4A through FIG. 4J, respectively.

Referring to FIG. 3, FIG. 4A and FIG. 5A, step S11 is performed, and a pad layer 200, a first mask layer 202 and a second mask layer 204 are sequentially formed on the semiconductor substrate 100. A top surface of the semiconductor substrate 100 may be entirely covered by the pad layer 200, the first mask layer 202 and the second mask layer 204. The first mask layer 204 may have sufficient etching selectivity with respect to the pad layer 200 and the semiconductor substrate 100. For instance, the first mask layer 204 may be formed of silicon nitride, while the pad layer 200 and the semiconductor substrate 100 may be formed of silicon oxide and silicon, respectively. In addition, the second mask layer 204 may have sufficient etching selectivity with respect to the first mask layer 202, the pad layer 200 and the semiconductor substrate 100. In some embodiments, the second mask layer 204 is a photoresist layer formed of a photosensitive material. In alternative embodiments, the second mask layer 204 is a hard mask layer formed of a photo-insensitive material. As an example, the pad layer 200 may be formed by a thermal oxidation process, while the first mask layer 202 may be formed by a deposition process, such as a chemical vapor deposition (CVD) process. In those embodiments where the second mask layer 204 is a photoresist layer, a method for preparing the second mask layer 204 may include a coating process. On the other hand, in those embodiments where the second mask layer 204 is a hard mask layer, the second mask layer 204 may be formed by a deposition process, such as a CVD process.

Figure 4B:
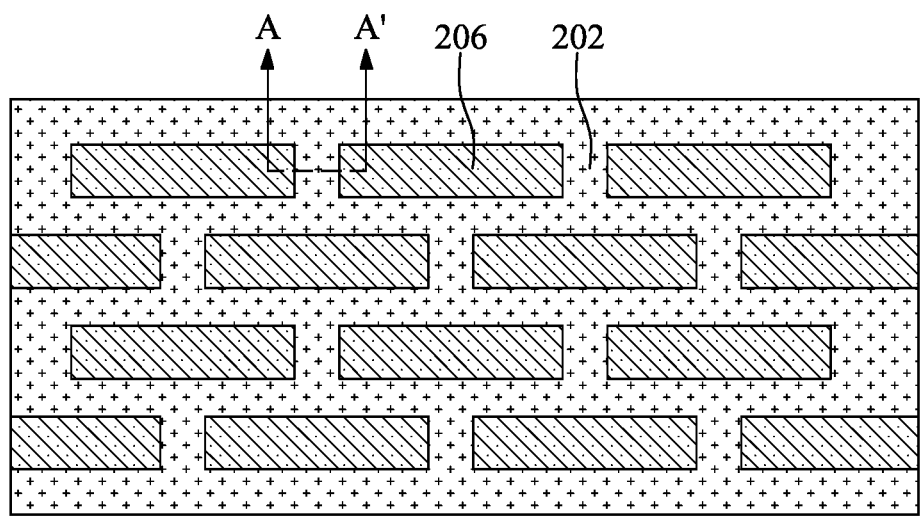
Figure 5B:
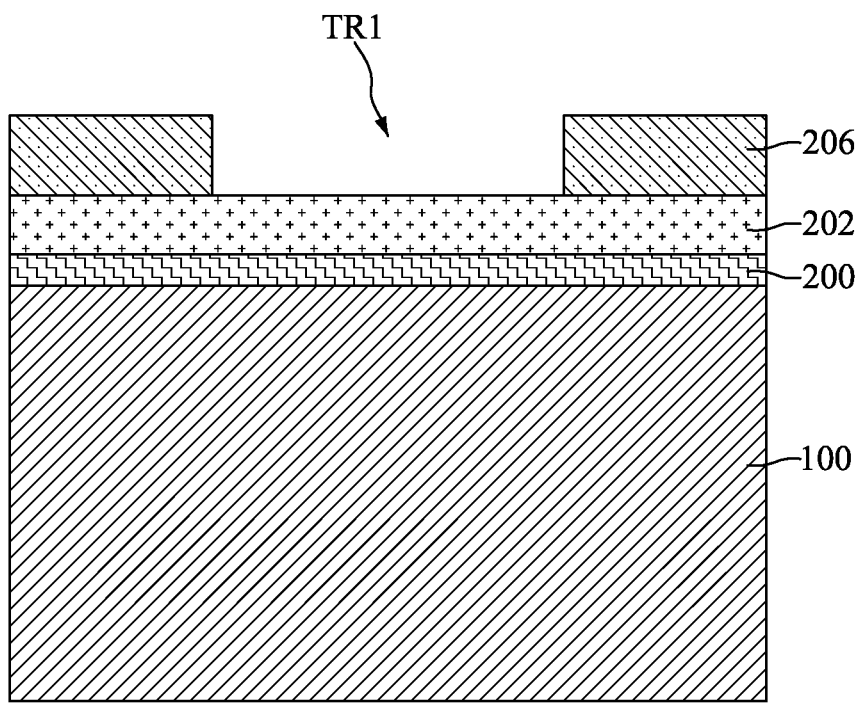

Referring to FIG. 3, FIG. 4B and FIG. 5B, step S13 is performed, and the second mask layer 204 is patterned to form discrete mask patterns 206. The mask patterns 206 are laterally separated from one another, and configured to define boundaries of the active areas AA to be formed in the following steps. A trench TR1 is formed along with formation of the mask patterns 206, and extends between the mask patterns 206. A portion of the first mask layer 202 overlapped with the trench TR1 is exposed. In those embodiments where the second mask layer 204 is a photoresist layer, the second mask layer 204 may be patterned to form the mask patterns 206 by a lithography process (e.g., including an exposure step and a development step). Alternatively, in those embodiments where the second mask layer 204 is a hard mask layer, a method for patterning the second mask layer 204 to form the mask patterns 206 may include a lithography process (e.g., including a photoresist coating step, an exposure step and a development step) and an etching process (e.g., an anisotropic etching process). During the etching process, the first mask layer 202 may be functioned as an etching stop layer.

Figure 4C:
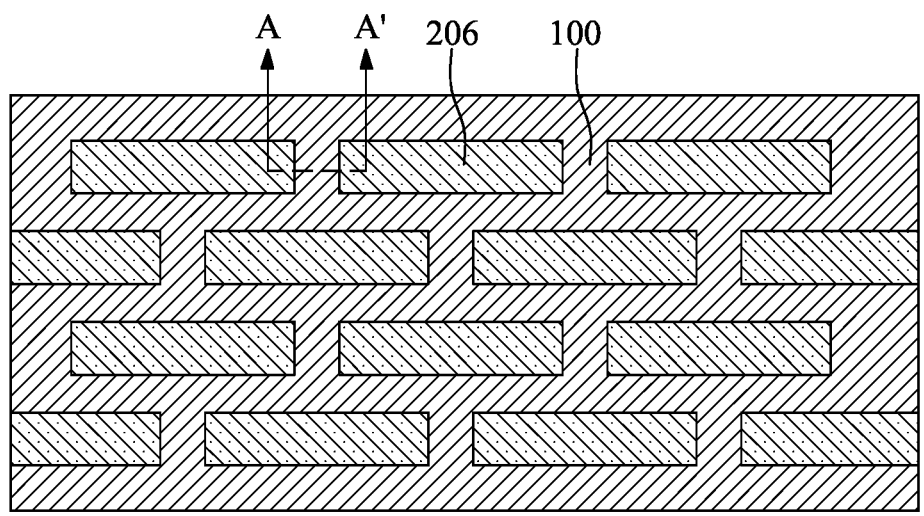
Figure 5C:
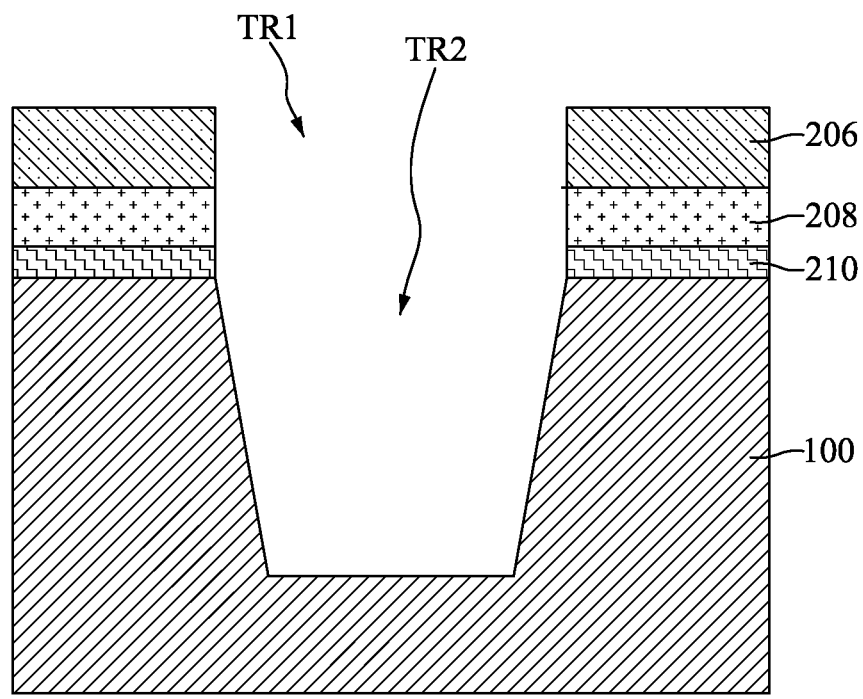

Referring to FIG. 3, FIG. 4C and FIG. 5C, step S15 is performed, and a trench TR2 extending into the semiconductor substrate 100 through the first mask layer 202 and the pad layer 200 is formed. Portions of the first mask layer 202, the pad layer 200 and the semiconductor substrate 100 overlapped with the trench TR1 defined between the mask patterns 206 are removed to form the trench TR2, such that the trench TR2 extends downwardly from a bottom end of the trench TR1. Along with removal of these portions of the first mask layer 202 and the pad layer 200, the first mask layer 202 and the pad layer 200 may be respectively patterned to form discrete patterns overlapped with the mask patterns 206. The discrete patterns of the remained first mask layer 202 are referred as mask patterns 208, and the discrete patterns of the remained pad layer 200 are referred as pad patterns 210. In some embodiments, a method for preparing the trench TR2 includes an etching process, such as an anisotropic etching process. During this etching process, the mask patterns 206 may be functioned as shadow masks.

Figure 4D:
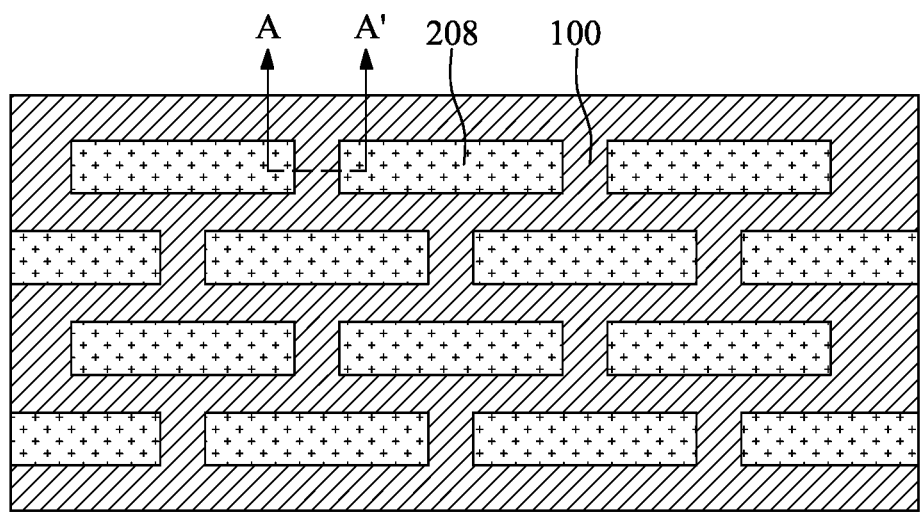
Figure 5D:
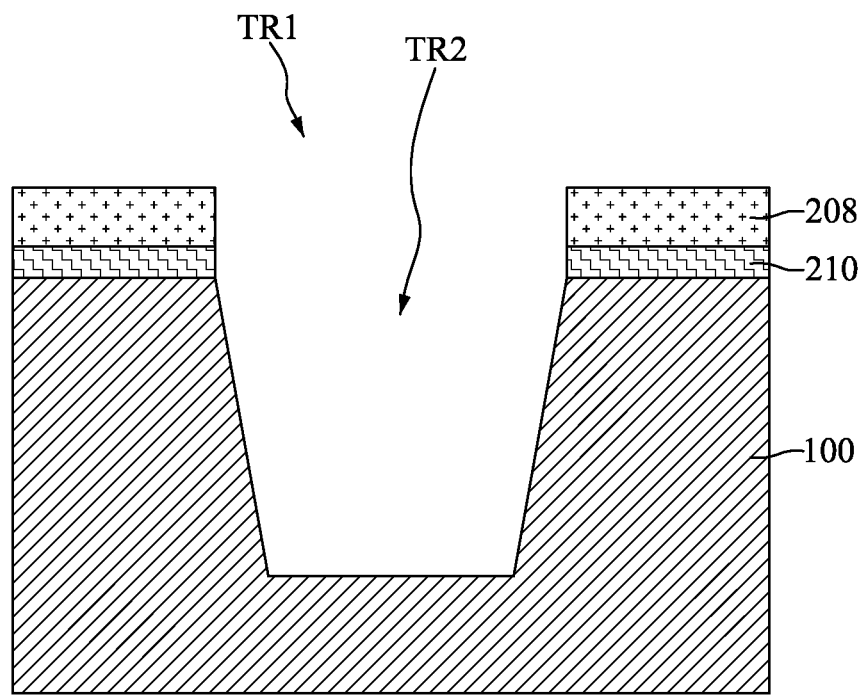

Referring to FIG. 3, FIG. 4D and FIG. 5D, step S17 is performed, and the mask patterns 206 are removed. By removing the mask patterns 206, top surfaces of the mask patterns 208 may be exposed. In those embodiments where the mask patterns 206 are formed of a photoresist material, the mask patterns 206 may be removed by a stripping process. In alternative embodiments where the mask patterns 206 are hard masks, the mask patterns 206 may be removed by an etching process, such as an isotropic etching process. The mask patterns 208, the pad patterns 210 and the semiconductor substrate 100 may have sufficient etching selectivity with respect to the mask patterns 206, and may be barely etched during such etching process.

Figure 4E:
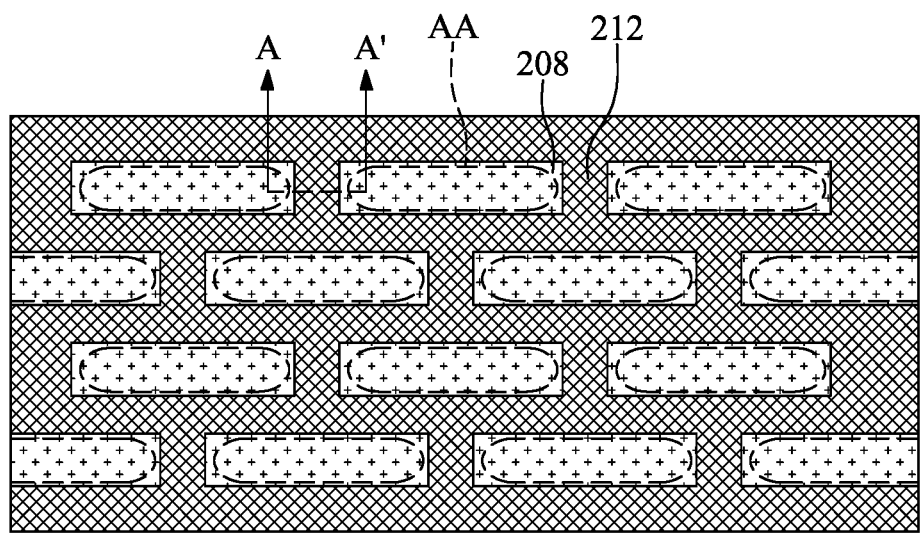
Figure 5E:
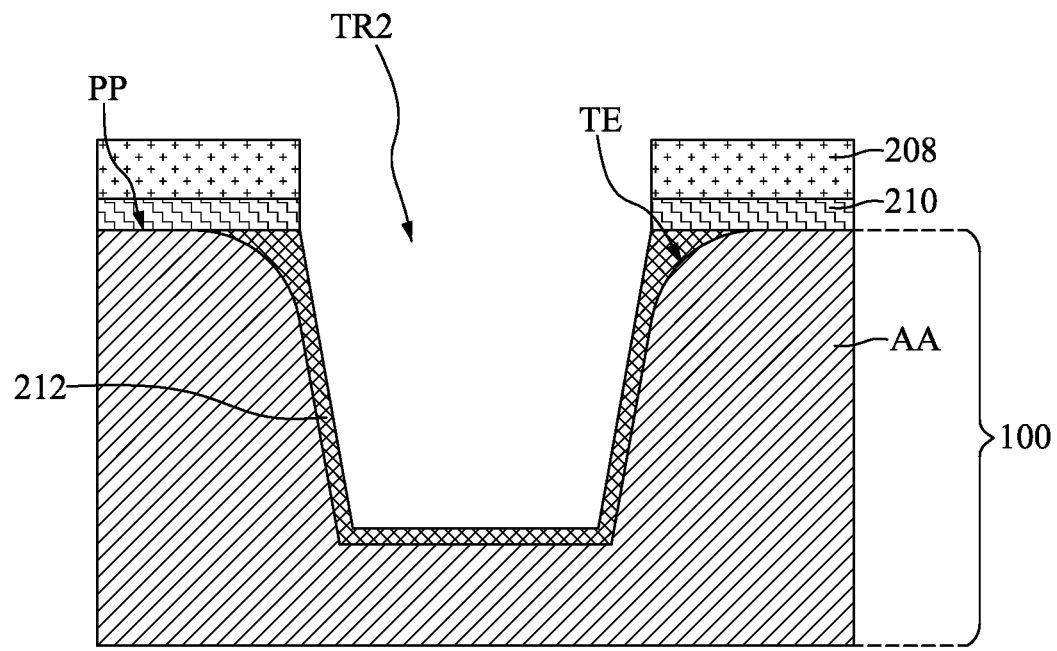

Referring to FIG. 3, FIG. 4E and FIG. 5E, step S19 is performed, and an oxidation process is performed. During the oxidation process, the semiconductor substrate 100 is oxidized from surfaces exposed in the trench TR2, and portions of the semiconductor substrate 100 subjected to oxidation turn into an oxide layer 212. The oxide layer 212 extends along sidewalls and a bottom surface of the trench TR2. Portions of the semiconductor substrate 100 being laterally separated from one another by the trench TR2 but not being oxidized are referred as the active areas AA, and sidewalls of the active areas AA are covered by oxide layer 212. As shown in FIG. 5E, an oxidation depth (i.e., a thickness of the oxide layer 212) near the top edges TE of the active areas AA is greater than an oxidation depth at sidewalls of the active areas AA. In these embodiments, the active areas AA are encroached by the oxidation process, and formed with the rounded or chamfered top edges TE. The dash lines shown in FIG. 4E indicate boundaries of portions of the active areas AA not being subjected to oxidation. As shown in FIG. 4E and FIG. 5E, the boundaries of these portions of the active areas AA are laterally recessed from boundaries of the mask patterns 208 and the pad patterns 210, which may result in contact area loss as described above. In some embodiments, the lateral recess is most significant at corners of the active areas AA. In embodiments where the mask patterns 208 and the pad patterns 210 are in rectangular shapes, the portions of the active areas AA not being affected by the oxidation may be formed in ellipse shapes.

Figure 4F:
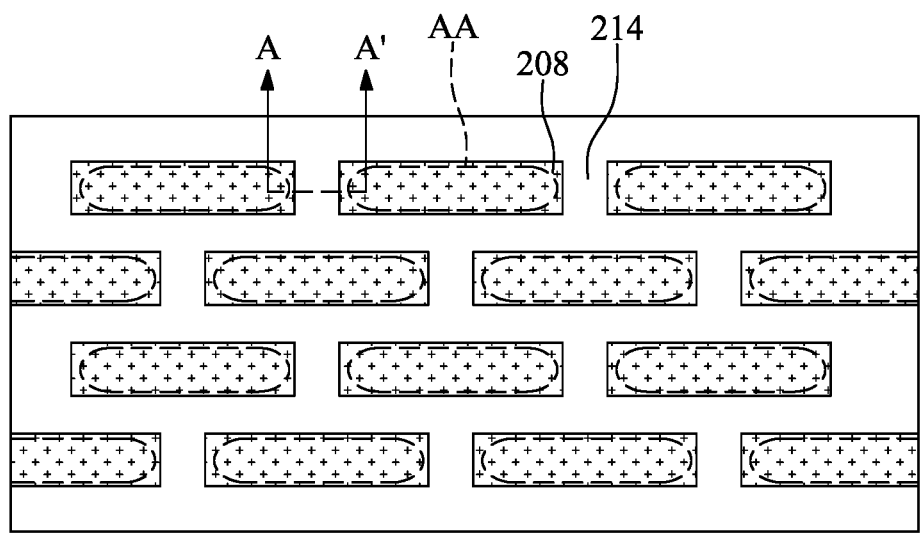
Figure 5F:
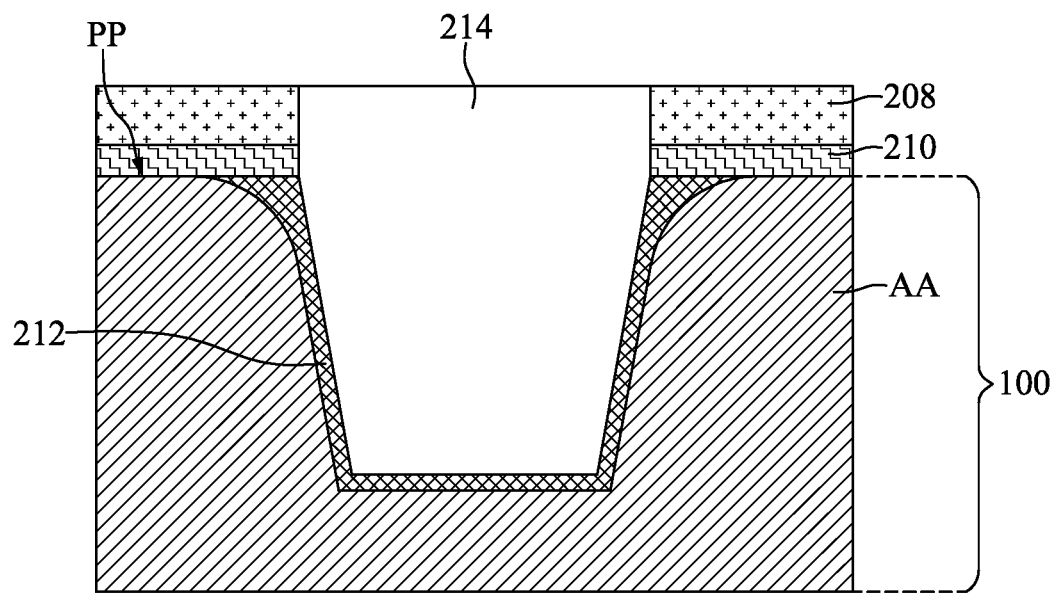

Referring to FIG. 3, FIG. 4F and FIG. 5F, step S21 is performed, and an insulating structure 218 is filled in the trench TR2. The insulating structure 218 may be further thinned in the following step, to form the lower insulating structure 108 as described with reference to FIG. 2B. Since the oxide layer 212 extends along the bottom surface and sidewalls of the trench TR2, the semiconductor substrate 100 can be separated from the insulating structure 218 by the oxide layer 212. In some embodiments, the insulating structure 218 fills up the trench TR2. In these embodiments, in addition to surfaces of the oxide layer 212 defining the bottom surface and sidewalls of the trench TR2, sidewalls of the mask patterns 208 and the pad patterns 210 are also in lateral contact with the insulating structure 218. Further, a top surface of the insulating structure 218 may be substantially coplanar with top surfaces of the mask patterns 208. A method for preparing the insulating structure 218 may include providing an insulting material on the structure shown in FIG. 4E and FIG. 5E by a deposition process, such as a CVD process. Subsequently, portions of the insulating material above the top surfaces of the mask patterns 208 may be removed by a planarization process, and a remained portion of the insulating material in the trench TR2 forms the insulating structure 218. For instance, the planarization process may include a polishing process, an etching process or a combination thereof.

Figure 4G:
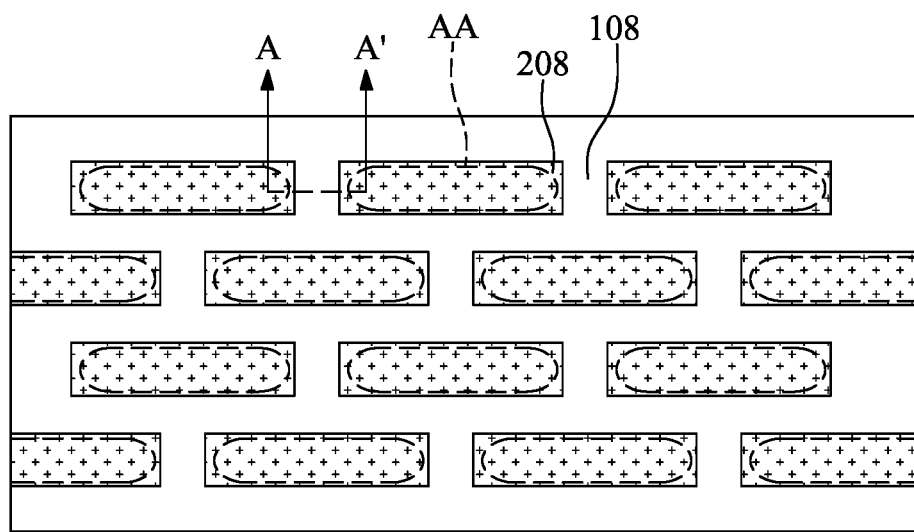
Figure 5G:
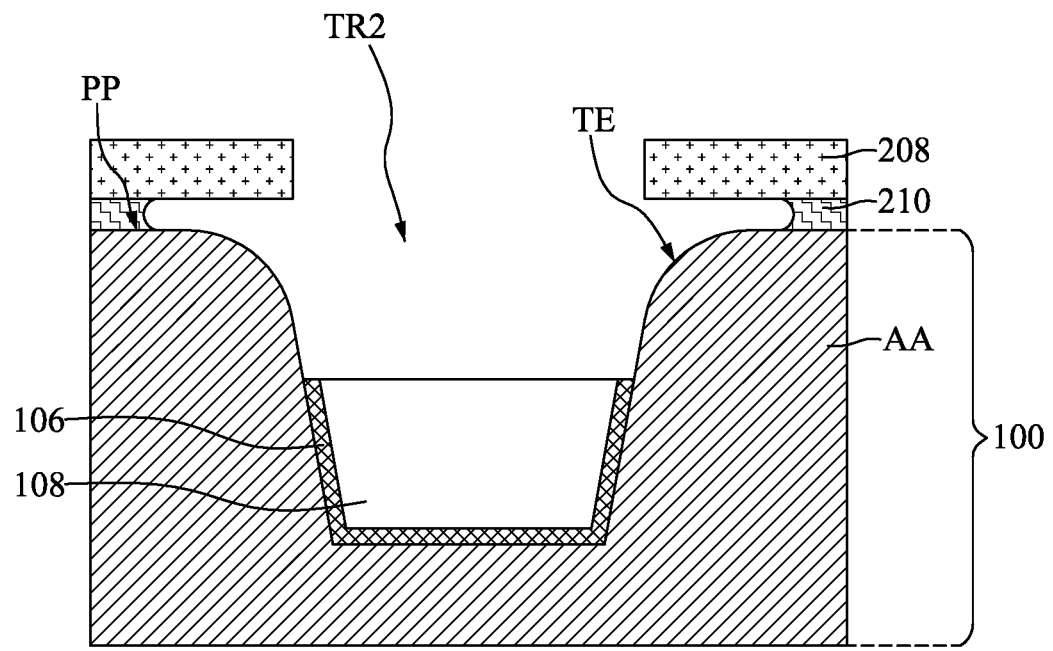

Referring to FIG. 3, FIG. 4G and FIG. 5G, step S23 is performed, and the insulating structure 218, the oxide layer 212 and the pad patterns 210 are partially removed. A top portion of the insulating structure 218 is removed, and the insulating structure 218 is thinned accordingly, to form the lower insulating structure 108 as described with reference to FIG. 2B. Along with removal of the top portion of the insulating structure 218, portions of the oxide layer 212 covering the top edges TE of the active areas AA are also removed, and remained portions of the oxide layer 212 form the lining layer 106 described with reference to FIG. 2B. Further, the pad patterns 210 may be laterally recessed from the sidewalls of the trench TR2 during partial removal of the insulating structure 218 and the oxide layer 212. By laterally recessing the pad patterns 210, the top edges TE of the active areas AA may be currently exposed. In some embodiments, a method for partially removing the insulating structure 218, the oxide layer 212 and the pad patterns 210 includes an isotropic etching process. The semiconductor substrate 100 and the mask patterns 208 may have sufficient etching selectivity with respect to the insulating structure 218 and the oxide layer 212, thus the semiconductor substrate 100 and the mask patterns 208 may be barely etched during such isotropic etching process. Further, the thickness of the lower insulating structure 108 and a height of the lining layer 106 can be determined by a process time of the isotropic etching.

Figure 4H:
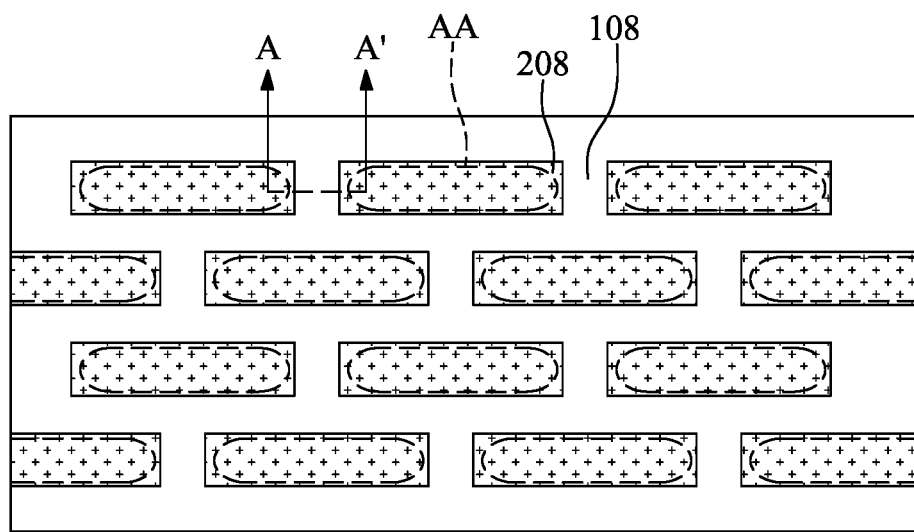
Figure 5H:
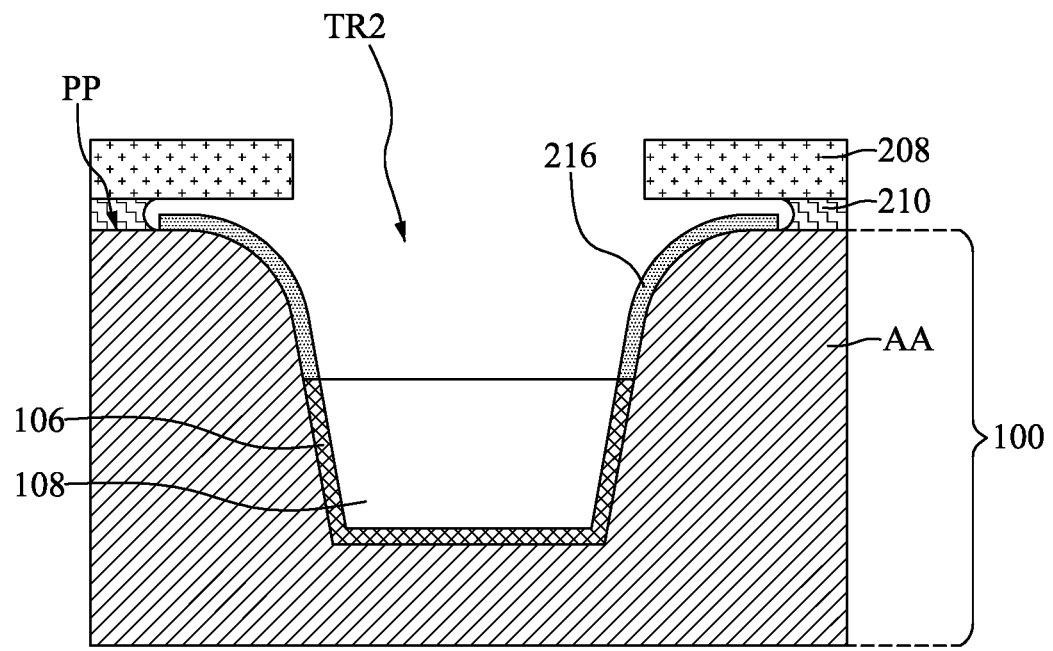

Referring to FIG. 3, FIG. 4H and FIG. 5H, step S25 is performed, and epitaxial layers 216 are formed. The epitaxial layers 216 may be subsequently processed to form the contact enhancement layers 102 as described with reference to FIG. 2A and FIG. 2B. The epitaxial layers 216 are selectively formed on the exposed top edges TE of the active areas AA, thus may not extend along exposed surfaces of the lower insulating structure 108, the pad patterns 210 and the mask patterns 208. Further, the top edges TE of the active areas AA may be conformally covered by the epitaxial layers 216. In some embodiments, topmost ends of the epitaxial layers 216 are slightly higher than the topmost surface of the semiconductor substrate 100 (i.e., the planar parts PP of the active areas AA). In these embodiments, portions of the epitaxial layers 216 above the topmost surface of the semiconductor substrate 100 may be removed, as will be further described with reference to FIG. 5J and FIG. 2B. The epitaxial layers 216 are formed by an epitaxial process. During the epitaxial process, the epitaxial layers 216 may selectively grow from exposed surfaces of the semiconductor substrate 100 (i.e., the top edges TE of the active areas AA), and the epitaxial process may be referred as a selective epitaxial process.

Figure 4I:
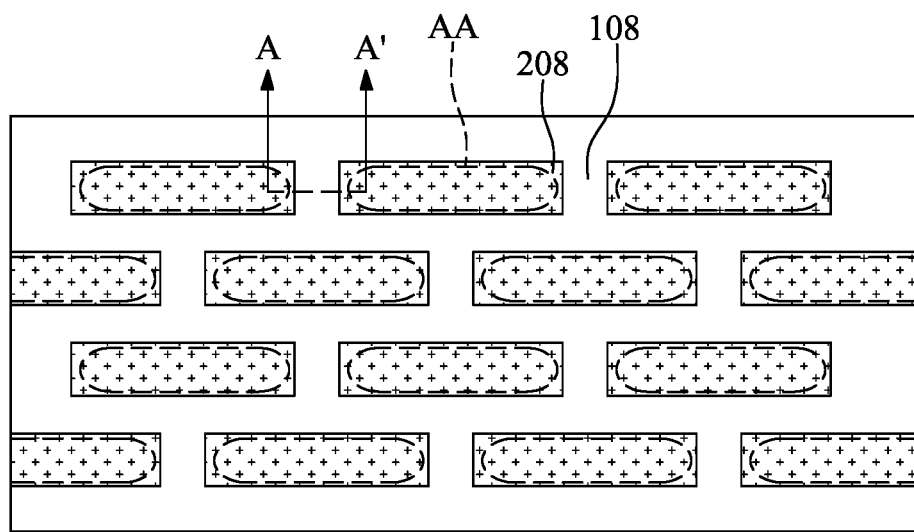
Figure 5I:
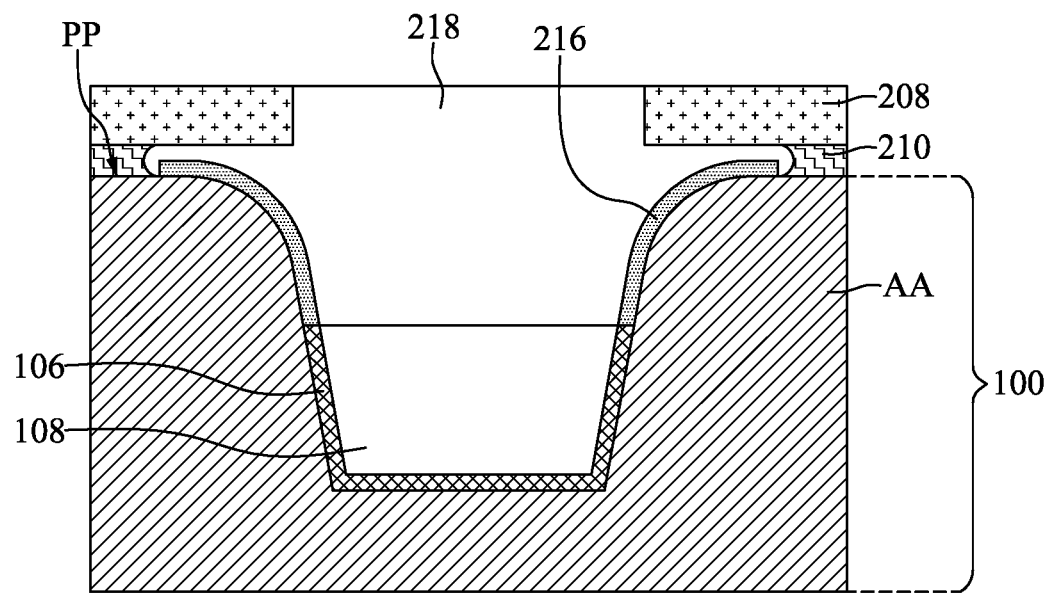

Referring to FIG. 3, FIG. 4I and FIG. 5I, step S27 is performed, and an insulating structure 218 is formed. The insulating structure 218 may be further shaped in following steps, to form the upper insulating structure 110 as described with reference to FIG. 2B. As formation of the insulating structure 218, the trench TR2 is currently filled up. The insulating structure 218 may cover a top surface of the lower insulating structure 108, and may be in lateral contact with the epitaxial layers 216. Further, spaces defined between peripheral regions of the active areas AA and the mask patterns 208 may be filled by the insulating structure 218. Accordingly, portions of the epitaxial layers 216 extending into these spaces may be covered by the insulating structure 218, and the pad patterns 210 may be in lateral contact with the insulating structure 218. In addition, these extending portions of the insulating structure 218 may be in contact with the mask patterns 208 from below. In some embodiments, a top surface of the insulating structure 218 is substantially coplanar with top surfaces of the mask patterns 208. A method for preparing the insulating structure 218 may include providing an insulating material on the structure as shown in FIG. 4H and FIG. 5H by a deposition process, such as a CVD process. Subsequently, a portion of the insulating material above the top surfaces of the mask patterns 208 is removed by a planarization process. For instance, the planarization process may include a polishing process, an etching process or a combination thereof.

Figure 4J:
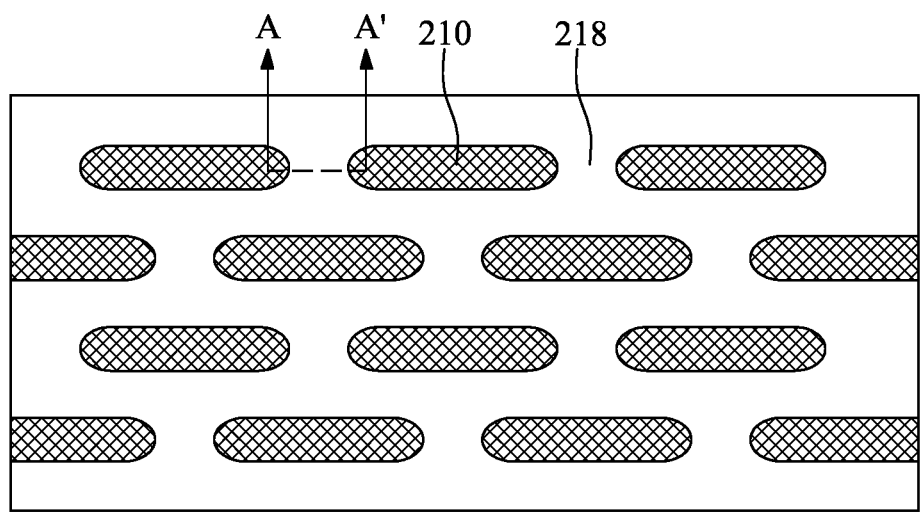
Figure 5J:
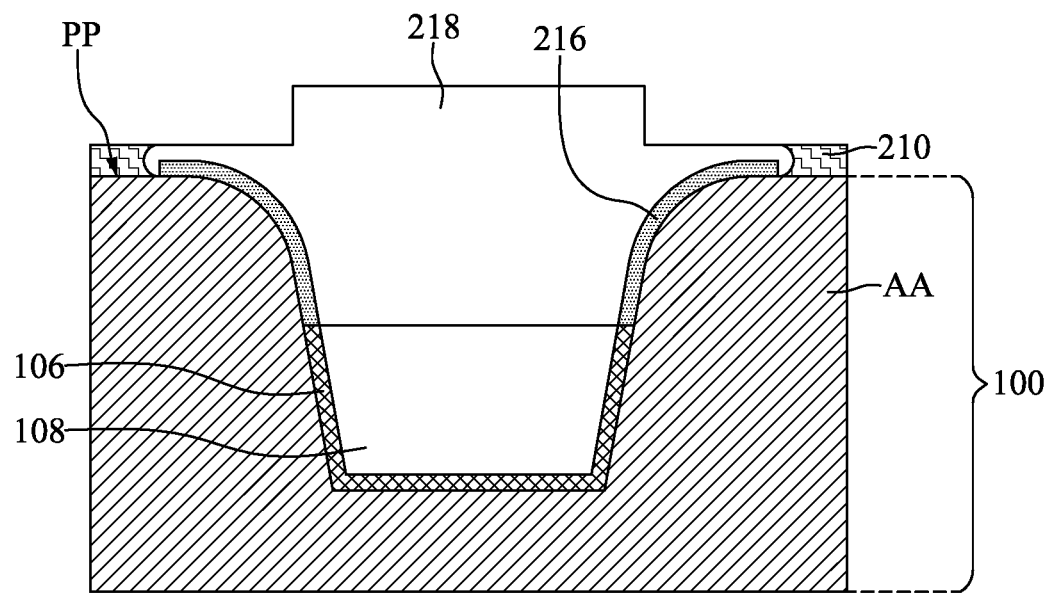

Referring to FIG. 3, FIG. 4J and FIG. 5J, step S29 is performed, and the mask patterns 208 are removed. By removing the mask patterns 208, the pad patterns 210 and portions of the insulating structure 218 used to be covered by the mask patterns 208 may be currently exposed. In some embodiments, the epitaxial layers 216 are remained buried in the insulating structure 218 in the current step. In addition, a portion of the insulating structure 218 used to be in lateral contact with the mask patterns 208 may currently appear as a protruding structure. A method for removing the mask patterns 208 may include an isotropic etching process. The pad patterns 210 may have sufficient etching selectivity with respect to the mask patterns 208, thus may be barely removed during such isotropic etching process.

Referring to FIG. 3, FIG. 2A and FIG. 2B, step S31 is performed, and pad patterns 210 are removed. By removing the pad patterns 210, the planar parts PP of the active areas AA can be exposed for further processing. Along with the removal of the pad patterns 210, portions of the insulating structure 218 above the planar parts PP of the active areas AA are removed. Accordingly, the insulating structure 218 is shaped to form the upper insulating structure 110. Similarly, portions of the epitaxial layers 216 above the planar parts PP of the active areas AA may be removed as well, and the epitaxial layers 216 are shaped to form the contact enhancement layers 102. In some embodiments, a method for removing the pad patterns 210 and shaping the insulating structure 218 as well as the epitaxial layers 216 includes a planarization process. For instance, the planarization process may include a polishing process, an etching process or a combination thereof.

Up to here, the active areas AA are defined along with formation of the isolation structure 104 and the contact enhancement layers 102. Subsequently, the current structure may be further processed to form a plurality of the memory cells 10 as described with reference to FIG. 1B.

In some embodiments, the structure described with reference to FIG. 2A and FIG. 2B are in a pattern dense region of a memory array. The memory array may further have a pattern loose region. A spacing between the active areas AA in the pattern loose region may be greater than a spacing between the active areas AA in the pattern dense region. Further, the contact enhancement layers 102 may be absent in the pattern loose region.

Figure 6A:
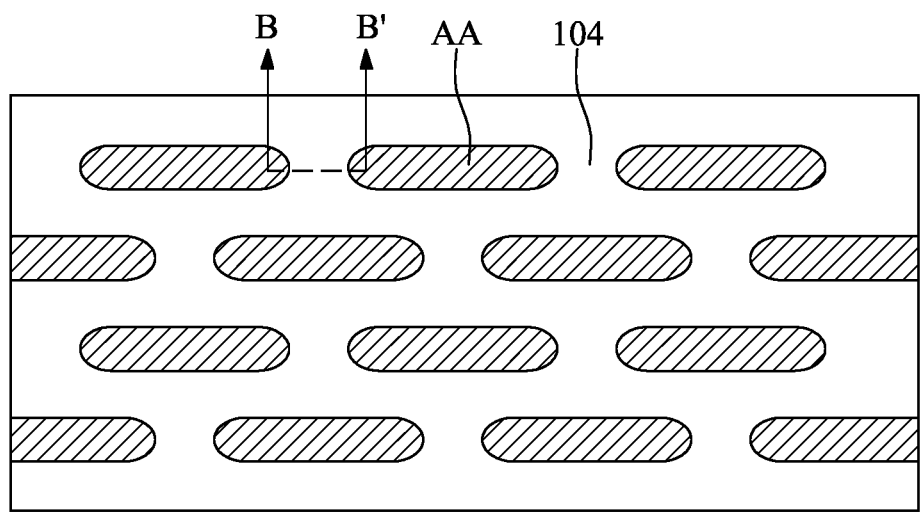
FIG. 6A is a schematic plan view illustrating the active areas in a pattern loose region of a memory array, according to some embodiments of the present disclosure.
Figure 6B:
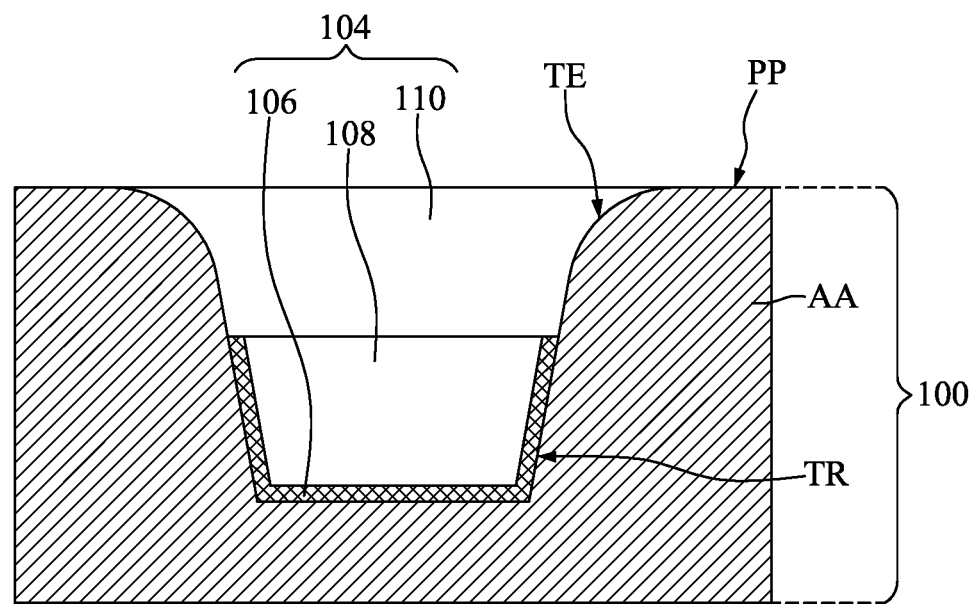
FIG. 6B is a schematic cross-sectional view along a line B-B' as shown in FIG. 6A.

FIG. 6A is a schematic plan view illustrating the active areas AA in a pattern loose region of a memory array, according to some embodiments of the present disclosure. FIG. 6B is a schematic cross-sectional view along a line B-B' as shown in FIG. 6A.

Referring to FIG. 6A and FIG. 6B, in a pattern loose region of a memory array, the contact enhancement layers 102 may be omitted, and peripheral regions of the active areas AA may be covered by the isolation structure 104. In some embodiments, the upper insulating structure 110 of the isolation structure 104 is disposed on the lining layer 106 and the lower insulating structure 108 of the isolation structure 104, and is in direct contact with the top edges TE of the active areas AA. In these embodiments, the peripheral regions of the active areas AA are covered by laterally extending portions of the upper insulating structure 110.

The process as described with FIG. 3, FIG. 4A-4J, FIG. 5A-5J, FIG. 2A and FIG. 2B can be used for both of the pattern dense region and the pattern loose region, except that the pattern loose region may be shielded during the step S25 as described with reference to FIG. 3, FIG. 4H and FIG. 5H. In some embodiments, during the step S25, the pattern loose region may be covered by a photoresist pattern, such that the epitaxial layers 216 to be shaped into the contact enhancement layers 102 may not grow from the exposed top edges TE of the active areas AA within the pattern loose region. After forming the epitaxial layers 216 within the pattern dense region, the photoresist pattern covering the pattern loose region may be removed by, for example, a stripping process or an ashing process. On the other hand, other steps may be performed on both of the pattern dense region and the pattern loose region.

As above, active areas of memory cells in a memory array may be encroached during manufacturing process, and formed with chamfered or rounded top edges. As a consequence, top surfaces of the active areas may descend toward these edges within peripheral regions of the active areas. Hence, the descending peripheral regions of the active areas may be covered by an isolation structure filled in a trench extending between the active areas, thus fail to establish electric contact with electrical components disposed on the active areas. By covering the chamfered or rounded top edges of the active areas with contact enhancement layers, surface recesses caused by the descending peripheral regions of the active areas may be filled up by the contact enhancement layers. Since the contact enhancement layers may be formed of a semiconductor material, the contact enhancement layers may be regarded as extra parts of the active areas. These extra parts of the active areas may contribute to electrical contact between the active areas and the electrical components disposed thereon, thus may compensate contact areas loss resulted from the encroachment during manufacturing process. Therefore, electrical contact between the active area and the electrical components disposed thereon can be improved.

In an aspect of the present disclosure, a memory cell is provided. The memory cell comprises: an active area, as a surface portion of a semiconductor substrate, wherein a top surface of the active area has a slope part descending toward an edge of the active area within a peripheral region of the active area; an isolation structure, formed in a trench of the semiconductor substrate laterally surrounding the active area; and a contact enhancement layer, covering the edge of the active area and in lateral contact with the isolation structure, wherein the slop part of the top surface of the active area is covered by the contact enhancement layer, and the contact enhancement layer is formed of a semiconductor material.

In another aspect of the present disclosure, a memory array is provided. The memory array comprises: active areas, as surface portions of a semiconductor substrate, wherein a top surface of each active area has a planar part and a slope part descending from the planar part to an edge of each active area within a peripheral region of each active area, a first group of the active areas in a pattern dense region of the memory array are laterally separated by a spacing less than a spacing by which a second group of the active areas in a pattern loose region of the memory array are laterally separated; an isolation structure, formed in a trench of the semiconductor substrate extending between the active areas; and contact enhancement layers, covering the edges of the active areas in the first group, and in lateral contact with the isolation structure, wherein the contact enhancement layers and the planar parts of the top surfaces of the active areas in the first group define contact areas of the active areas in the first group.

In yet another aspect of the present disclosure, a method for preparing a memory cell is provided. The method comprises: forming a trench at a top surface of a semiconductor substrate, wherein an active area of the memory cell is defined in a region of the semiconductor substrate laterally surrounded by the trench; performing an oxidation process to form an oxide layer extending along a bottom surface and a sidewall of the trench, wherein an oxidation depth at a top edge of the active area is greater than an oxidation depth at the sidewall and the bottom surface of the trench; removing an upper portion of the oxide layer covering the top edge of the active area; forming an epitaxial layer to cover the top edges of the active area; and filling up the trench with an insulating material.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for preparing a memory cell, comprising:
   forming a trench at a top surface of a semiconductor substrate, wherein an active area of the memory cell is defined in a region of the semiconductor substrate laterally surrounded by the trench;
   performing an oxidation process to form an oxide layer extending along a bottom surface and a sidewall of the trench, wherein an oxidation depth at a top edge of the active area is greater than an oxidation depth at the sidewall and the bottom surface of the trench;
   removing an upper portion of the oxide layer covering the top edge of the active area;
   forming an epitaxial layer to cover the top edges of the active area; and
   filling up the trench with an insulating material; and
   filling up the trench by an additional insulating material after performing the oxidation process and before removing the upper portion of the oxide layer.

2. The method for preparing the memory cell according to claim 1, wherein the epitaxial layer is selectively formed on the top edge of the active area.

3. The method for preparing the memory cell according to claim 1, wherein an upper portion of the additional insulating material is removed during removal of the upper portion of the oxide layer, and the remained portion of the additional insulating material forms a lower insulating structure in a lower portion of the trench.

4. The method for preparing the memory cell according to claim 3, wherein the insulating material is filled in an upper portion of the trench after formation of the epitaxial layer.

5. The method for preparing the memory cell according to claim 4, wherein the insulating material is filled to a height above the top surface of the semiconductor substrate.

6. The method for preparing the memory cell according to claim 5, further comprising:
   removing a portion of the insulating material above the top surface of the semiconductor substrate and a portion of the epitaxial layer above the top surface of the semiconductor substrate, wherein the remained portion of the insulating material forms an upper insulating structure in the trench, and the remained portion of the epitaxial layer forms a contact enhancement layer covering the top edge of the active area.

\* \* \* \* \*